(12) United States Patent
Pulijala et al.

(10) Patent No.: US 9,595,929 B2
(45) Date of Patent: Mar. 14, 2017

(54) DISTRIBUTED POLE-ZERO COMPENSATION FOR AN AMPLIFIER

(71) Applicant: Texas Instruments Incorporated, Dallas, TX (US)

(72) Inventors: Srinivas K. Pulijala, Tucson, AZ (US); Steven G. Brantley, Satellite Beach, FL (US)

(73) Assignee: Texas Instruments Incorporated, Dallas, TX (US)

( * ) Notice: Subject to any disclaimer, the term of this patent is extended or adjusted under 35 U.S.C. 154(b) by 183 days.

(21) Appl. No.: 14/508,755

(22) Filed: Oct. 7, 2014

(65) Prior Publication Data

US 2015/0102858 A1    Apr. 16, 2015

Related U.S. Application Data

(60) Provisional application No. 61/889,913, filed on Oct. 11, 2013.

(51) Int. Cl.
*H03F 3/04* (2006.01)
*H03F 3/20* (2006.01)
*H03F 1/14* (2006.01)

(52) U.S. Cl.
CPC ............... *H03F 3/20* (2013.01); *H03F 1/14* (2013.01); *H03F 2200/135* (2013.01); *H03F 2200/153* (2013.01); *H03F 2200/171* (2013.01); *H03F 2200/297* (2013.01); *H03F 2200/408* (2013.01)

(58) Field of Classification Search
CPC .......................................................... H03F 3/04
USPC ........................................ 330/107, 305, 302
See application file for complete search history.

(56) References Cited

U.S. PATENT DOCUMENTS

| | | | | |
|---|---|---|---|---|
| 4,908,566 | A * | 3/1990 | Tesch ........................ | G05F 1/56 323/280 |
| 6,259,238 | B1 * | 7/2001 | Hastings ................... | G05F 3/30 323/273 |
| 6,300,749 | B1 * | 10/2001 | Castelli ................... | G05F 1/575 323/273 |
| 2003/0111986 | A1 * | 6/2003 | Xi ........................... | G05F 1/575 323/280 |
| 2003/0218450 | A1 * | 11/2003 | Bonte ..................... | G05F 1/575 323/273 |
| 2006/0012356 | A1 * | 1/2006 | Kase ....................... | G05F 1/575 323/282 |
| 2014/0152279 | A1 * | 6/2014 | Howes ..................... | G05F 1/46 323/273 |
| 2014/0191739 | A1 * | 7/2014 | Kim ........................ | G05F 1/575 323/280 |

* cited by examiner

*Primary Examiner* — Patricia T Nguyen
(74) *Attorney, Agent, or Firm* — Goutham Kondapalli; Charles A. Brill; Frank D. Cimino

(57) ABSTRACT

An amplifier includes an amplifier input and an amplifier output. A compensation network is coupled to the amplifier output. The compensation network includes at least one RC network tuned to a frequency in which the amplifier operates. The compensation network provides at least one zero to compensate for at least one pole introduced by a load coupled to the amplifier output.

18 Claims, 3 Drawing Sheets

DISTRIBUTED POLE-ZERO COMPENSATION FOR AN AMPLIFIER

This application claims priority to U.S. provisional patent application 61/889,913 of Srinivas K. Pulijala, filed on Oct. 11, 2013 for DISTRIBUTED POLE-ZERO COMPENSATION SCHEME FOR AN AMPLIFIER, which is hereby incorporated by reference for all that is disclosed therein.

BACKGROUND

In many amplifier applications, the amplifier drives a capacitive load or a load that is substantially capacitive. In some applications, such as successive approximation register (SAR) analog to digital converter (ADC) drivers, which include amplifiers, a resistor/capacitor (RC) filter is typically required at the output of the amplifier. The SAR ADC has an internal sampling capacitor, wherein the filter typically requires an output capacitor that is much larger than the sampling capacitor. Accordingly, the amplifier sees this larger output capacitor. In some situations, the value of the output capacitor can be as much as twenty times larger than the value of the sampling capacitor. In applications such as SAR ADCs, where the amplifier directly drives capacitive loads, the large output capacitance results in a phase shift at the output of the amplifier, which causes the amplifier to be unstable.

In addition to the stability issues, when the output load is substantially capacitive, the output stage of the amplifier typically has to expend a significant amount of power in order to operate the amplifier over a usable bandwidth, which reduces the efficiency of the amplifier.

SUMMARY

An amplifier includes an amplifier input and an amplifier output. A compensation network is coupled to the amplifier output. The compensation network includes at least one filter tuned to a frequency in which the amplifier operates. The compensation network provides at least one zero to compensate for at least one pole introduced by a load coupled to the amplifier output.

An aspect of the amplifier may include a first stage having an input, an output, and a first transconductance, wherein the input is coupled to the amplifier input. A second stage has an input, an output, and a second transconductance, wherein the input is coupled to the output of the second stage. A third stage has an input, an output, and a third transconductance, wherein the input is coupled to the output of the second stage, the output being coupled to the amplifier output. A first feedback capacitance is coupled between the amplifier output and the input of the second stage. A second feedback capacitance is coupled between the amplifier output and the input of the third stage. In some aspects of the amplifier, the first feedback capacitance and the second feedback capacitance may be Miller capacitances. Some of the aspects of the third transconductance may be substantially greater than the first transconductance and the second transconductance.

Some aspects of the compensation network may include a plurality of RC networks, wherein each network comprises a resistance and a capacitance coupled in series and each network is coupled to the amplifier output. Some aspects of the network may include a plurality of RC networks providing staggered at least one half pole roll off with approximately a forty five degree margin per RC network.

Some aspects of the RC network may include a plurality of series RC networks coupled in parallel. A first network includes a resistor having a first resistor value and a first capacitor having a first capacitor value. A second network includes a second resistor having a value of the first resistor and a second capacitor having a value of half the value of the first capacitor.

The RC network may include a plurality of series RC networks coupled in parallel. A first network includes a resistor having a first resistor value and a first capacitor having a first capacitor value. Each successive network includes a resistor and a capacitor wherein the value of the capacitor is half the value of the capacitor in the preceding network. In some aspects of the network, all of the resistors may have approximately the same value.

The RC network may include a plurality of RC networks coupled in parallel to the output. A first RC network is tuned to a first frequency and each successive RC network is tuned to twice the frequency of the previous RC network.

In some aspects of the Application, the phase shift at the output may be approximately forty-five degrees at an operating frequency of the amplifier. Some amplifiers may include a plurality of amplification stages between the input and the output. In some of these aspects, each amplification stage has a transconductance associated therewith and the stage closest to the amplifier output has the greatest transconductance.

Another aspect of the amplifier may include an amplifier input and an amplifier output. A first amplification stage has an input, an output, and a first transconductance, wherein the input is coupled to the amplifier input. A last amplification stage has an input, an output, and a last transconductance, wherein the output is coupled to the amplifier output. At least one feedback capacitance is coupled between the amplifier output and an input to one of the amplification stages. A compensation network is coupled to the amplifier output. The compensation network includes a plurality of RC networks, wherein a first of the RC networks is tuned to a first frequency in which the amplifier operates. Successive ones of the RC networks are tuned to multiples of the first frequency. The compensation network provides at least one zero to compensate for at least one pole introduced by a load coupled to the amplifier output.

Another aspect of the amplifier may include an amplifier input and an amplifier output. A first amplification stage has an input, an output, and a first transconductance, wherein the input is coupled to the amplifier input. A second amplification stage has an input, an output, and a second transconductance, wherein the input is coupled to the output of the second amplification stage. A third amplification stage has an input, an output, and a third transconductance, wherein the input is coupled to the output of the second amplification stage. The output is coupled to the amplifier output. The third transconductance is frequency dependent. A first feedback capacitance is coupled between the amplifier output and the input of the second amplification stage. A second feedback capacitance is coupled between the amplifier output and the input of the third amplification stage. A compensation network is coupled to the amplifier output. The compensation network includes a plurality of RC networks coupled in parallel to the output. A first RC network is tuned to a first frequency and each successive RC network is tuned to twice the frequency of the previous RC network. The compensation network provides at least one zero to compensate for at least pole introduced by a load coupled to the amplifier output.

DETAILED DESCRIPTION

Figure 1:
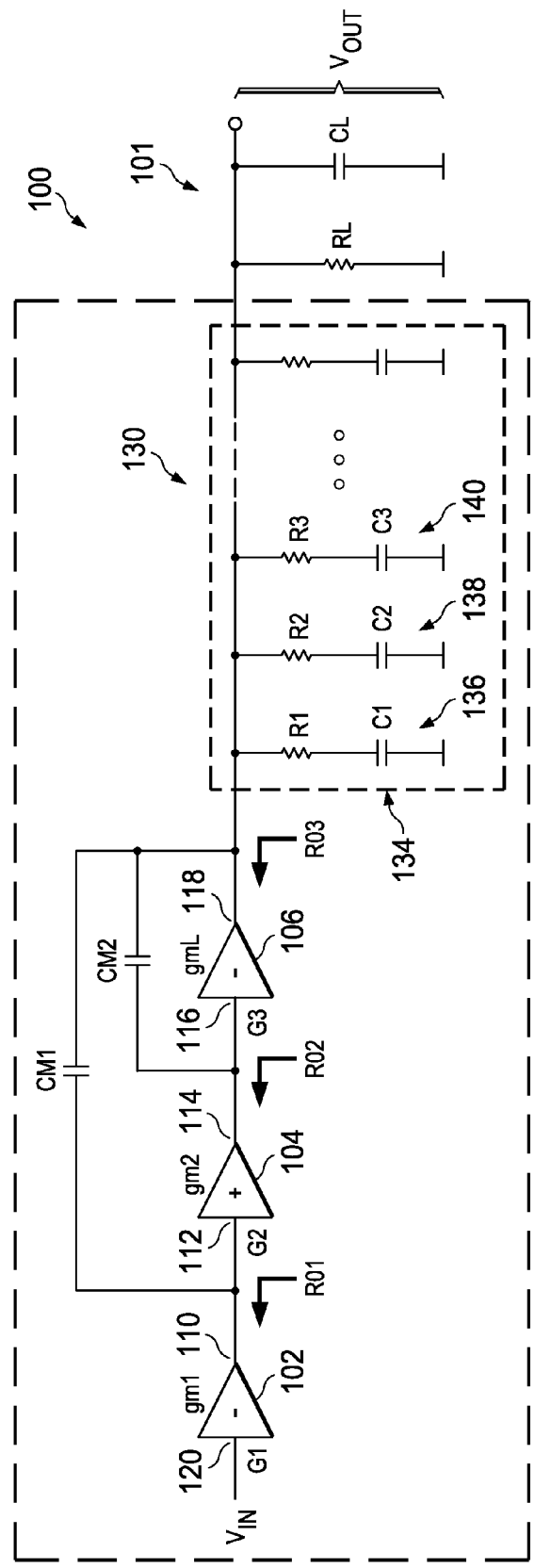
FIG. 1 is a schematic illustration of an amplifier coupled to a capacitive load.

Low power amplifiers and methods of amplification that are able to drive capacitive loads while remaining stable are disclosed herein. More specifically, distributive resistor/capacitor (RC) networks are coupled to the output of the amplifiers in order to make loads coupled to the amplifier outputs look resistive in a bandwidth of interest. Reference is made to FIG. 1, which is a schematic illustration of an embodiment of an amplifier 100 coupled to a load 101. In the amplifier 100 of FIG. 1, the load 101 is a capacitive load CL coupled in parallel with a resistive load RL. The capacitive load CL is substantially large, so the output load seen by the amplifier 100 is substantially capacitive. The capacitors, resistors, and/or other impedances coupled to the amplifier 100 are referred to collectively as the load 101.

The amplifier 100 of FIG. 1 has three stages, a first stage 102, a second stage 104, and a third stage 106. Miller compensation capacitors CM1 and CM2 provide feedback to the third stage 106 and the second stage 104 as shown in FIG. 1. A resistance RO1 is the resistance looking into the output 110 of the first stage 102, which is coupled to the input 112 of the second stage 104. The first stage 102 has a transconductance gm1. A resistance RO2 is the resistance looking into the output 114 of the second stage 104, which is coupled to the input 116 of the third stage 106. The second stage 104 has a transconductance gm2. The third stage 106 has a transconductance gmL and has a resistance RL looking into the output 118. The output 118 of the third stage 106 is the output of the amplifier 100, which drives an output voltage $V_{OUT}$. The input 120 of the first stage 102 is the input of the amplifier 100 and is coupled to an input voltage $V_{IN}$.

The amplifier 100 in combination with a compensation network 130 reduces the phase shift between the input voltage $V_{IN}$ and the output voltage $V_{OUT}$ as described in greater detail below. More specifically, the compensation network 130 serves to make the output of the amplifier 100 more resistive at the frequencies of interest, which stabilizes the amplifier 100.

The compensation network 130 is coupled to the output 118 of the third stage 106. The compensation network 130 includes a plurality of resistor/capacitor (RC) networks coupled in parallel to the output 118. As described in greater detail below, the compensation network 130 provides zeros to compensate for a pole generated by the load 101. The compensation network 130 provides staggered zeros, so that the phase shift from the third stage 106 is minimized for a wide range of frequencies, especially when the load resistance RL is very large. The reduced phase shift reduces the power in the third stage 106 while maintaining stability in the amplifier 100. The compensation network 130 also enables the amplifier 100 to be stable with a wide range of load impedances coupled to the output 118. In addition, the minimal phase shift reduces the overall power consumption of the amplifier 100.

Figure 2:
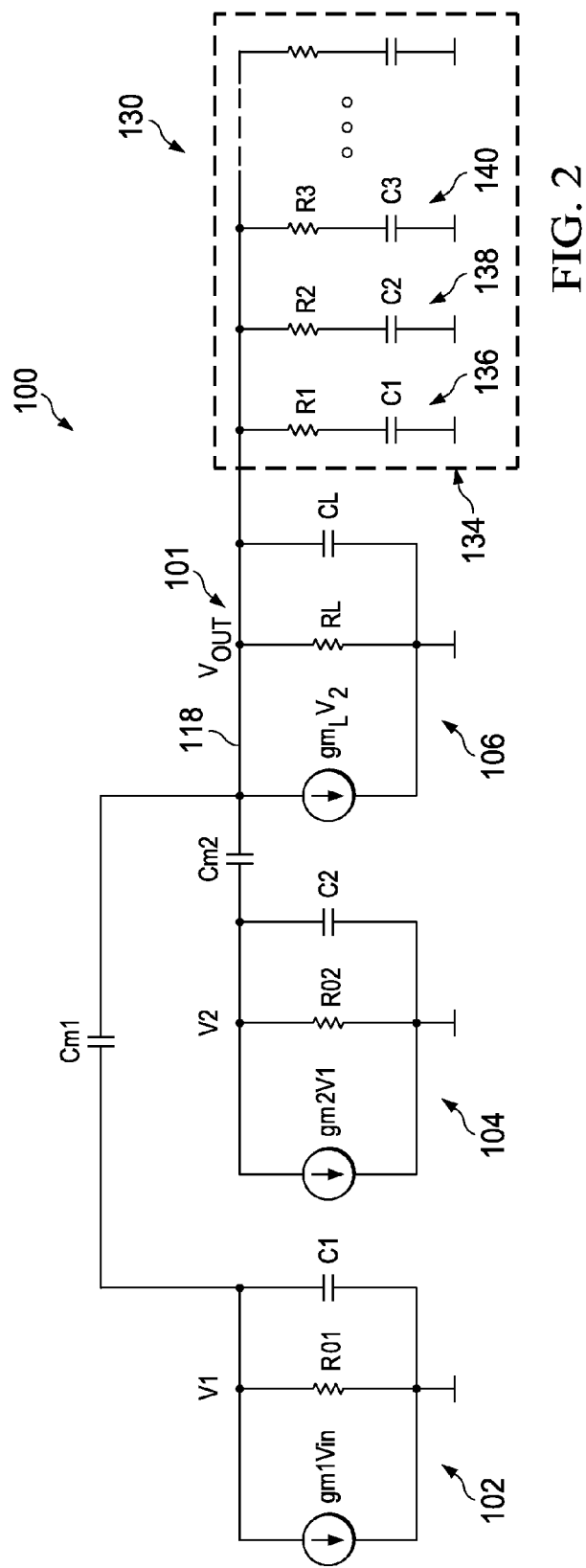
FIG. 2 is an equivalent circuit of the amplifier of FIG. 1.

Additional reference is made to FIG. 2, which is an equivalent circuit of the amplifier 100 of FIG. 1. The gain of the amplifier 100, without taking the compensation network 130 into consideration, is given by equation (1) as follows:

$$Av(s) = \frac{gm_1 R_{O1} gm_2 R_{O2} gm_L R_L \left[ 1 - s\frac{Cm_2}{gm_L} - s^2 \frac{Cm_1 Cm_2}{gm_2 gm_L} \right]}{\left( 1 + \frac{1}{sCm_1 R_{O1} gm_2 R_{O2} gm_L(s) R_L} \right) \left[ 1 + s\frac{Cm_2 \left( \frac{gm_L}{gm_2} - \right)}{gm_2 gm_1} + s^2 \frac{C_L Cm_2}{gm_2 gm_1} \right]} \quad \text{Equation (1)}$$

As shown in equation (1), the amplifier 100 has two complex right hand plane (RHP) zeros in the numerator and two complex left hand plane (LHP) poles in the denominator. The RHP zeros can be rendered insubstantial by choosing a value of gmL that is extremely large relative to gm2. Equation (1) then reduces to equation (2) by making gmL a function of frequency in the frequency band of interest, wherein the frequency band of interest is a frequency band in which the amplifier 100 operates.

$$Av(s) = \frac{gm_1 R_{O1} gm_2 R_{O2} gm_L(s) R_L}{(1 + sCm_1 R_{O1} gm_2 R_{O2} gm_L(s) R_L)\left[1 + s\frac{cm_2}{gm_L}\right]} \quad \text{Equation (2)}$$

Equation (2) is now stable with the capacitive load CL by tuning the Miller capacitance Cm2 and/or transconductance gm2.

Referring again to FIG. 1 and equation (2), the external load capacitance CL causes a ninety degree phase shift in the output voltage $V_{OUT}$ of the amplifier 100 without the compensation network coupled thereto. However, the compensation network 130 makes the impedance seen by the third stage 106 of the amplifier 100 resistive at the frequency and/or bandwidth of interest. Therefore, the phase shift due to the impedance of the load capacitance CL as seen from the third stage 106 is reduced. In some embodiments, the phase shift is reduced from ninety degrees to approximately forty-five degrees by the compensation network 130. This phase reduction compensates for a pole caused by the capacitive load CL, which stabilizes the amplifier 100 at the frequency of interest.

As shown in FIG. 1 and as briefly described above, the compensation network 130 of FIG. 1 has a plurality of RC networks 134 coupled to the output 118. The RC networks 134 are referred to as being staggered in that they all have different cut-off frequencies. In the amplifier 100 of FIG. 1, the RC networks 134 are staggered to provide one half pole roll off each. A first RC network 136 has a resistor R1 and a capacitor C1 that are tuned to the frequency of interest. A second RC network 138 has a resistor R2 that is the same value as the resistor R1, however, a capacitor C2 has half the value as the capacitor C1. A third RC network has a resistor R3 that has the same value as the resistor R1 and a capacitor C3 that has a value of one fourth the value of the capacitor C1. Successive RC networks have the same resistor values as the resistor R1 and capacitor values of $C1/2^{n-1}$, wherein the n is the nth RC network. Accordingly, each network is tuned to twice the frequency of its previous network. Other network configurations can achieve the same results, such as networks using the same capacitance values and different resistance values.

By staggering the frequencies of the compensation network 130, the phase shift from the third stage 106 due to the capacitive load CL is minimized for a wide range of frequencies across process, voltage, and temperature (PVT) variations. The minimized phase shift reduces the power in the third stage 106 and still achieves stability in the amplifier 100. In addition, the reduced phase shift also stabilizes the amplifier 100 over a wide range of load impedances.

Figure 3:
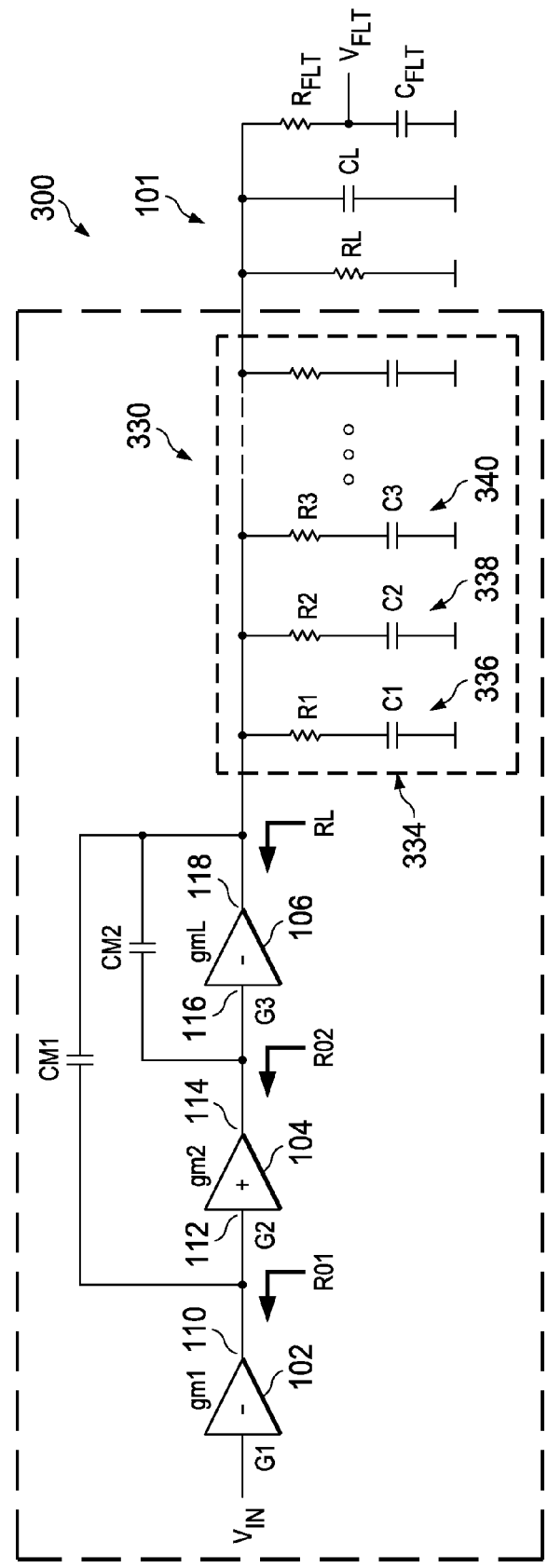
FIG. 3 is a schematic illustration of the amplifier of FIG. 1 driving a load equivalent to the load in a successive approximation register (SAR) analog to digital converter (ADC).

FIG. 3 is an aspect of the present amplifier 300 that is configured to drive a successive approximation register (SAR) analog to digital converter (ADC) (not shown) or a similar device. This aspect of the present amplifier 300 includes a filter capacitance $C_{FLT}$, which is substantially large. A filter resistor $R_{FLT}$ is coupled in series with the filter capacitance $C_{FLT}$. In some aspects of the amplifier 300, the filter resistance $R_{FLT}$ is relatively small. For example, the value of the filter capacitance $C_{FLT}$ can as much as twenty times the value of a sampling capacitor (not shown) in the SAR ADC or other capacitance in the device being driven by the amplifier 300. In some aspects of the amplifier 300, the filter capacitance $C_{FLT}$ can have a value of approximately 1.2 nF and the filter resistance $Rp_{FLT}$ can have a value of approximately 25Ω. In some aspects of the amplifier 300, the load 101 coupled to the amplifier 100 is capacitive and does not include the filter resistance $R_{FLT}$. The output of the amplifier 300 is the voltage $V_{FLT}$, which is across the capacitance $C_{FLT}$.

The compensation network, 330 includes a plurality of RC networks 334, which include a first RC network 336, a second RC network 338, and a third RC network 340. The RC networks 334 are tuned as described above to compensate for a pole or poles introduced by the load 101. Accordingly, the amplifier 300 is able to drive the capacitive load of the device while remaining stable.

In conventional amplifiers that do not include the compensation network 330, the conventional amplifier may become unstable due to the large capacitance $C_{FLT}$, especially for high bandwidth amplifiers with low quiescent current in the output stage. The amplifier 300 and others described herein are stable because the compensation network 330 makes the output of the amplifier 300 look resistive. For example, the RC network 336 is tuned to the frequency used by the SAR ADC or other device. In addition, the remaining RC networks 338 and 340 are tuned as described above, which provides the roll off described above. It follows that the amplifier 300 is stable when driving the SAR ADC at the frequency of interest and that the output power consumed by the amplifier 300 is reduced relative to conventional amplifiers.

Although illustrative embodiments have been shown and described by way of example, a wide range of alternative embodiments is possible within the scope of the foregoing disclosure.

What is claimed is:

1. An amplifier comprising:
an amplifier input and an amplifier output;
a first amplification stage having an input and an output, the input of the first amplification stage being coupled to the amplifier input;
a second amplification stage having an input and an output, the input of the second amplification stage being coupled to the output of the first amplification stage;
a third amplification stage having an input and an output, the input of the third amplification stage being coupled to the output of the second amplification stage and the output of the third amplification stage being coupled to the amplifier output;
a first feedback capacitor coupled between the amplifier output and at least one of: the input of the second amplification stage and the input of the third amplification stage; and
a compensation network coupled to the amplifier output, the compensation network comprising at least one RC network tuned to a frequency in which the amplifier operates, the compensation network providing at least one zero to compensate for at least one pole introduced by a load coupled to the amplifier output.

2. The amplifier of claim 1, and further comprising:
a second feedback capacitor coupled between the amplifier output and at least one of: the input of the second amplification stage and the input of the third amplification stage, wherein the second feedback capacitor is coupled to the input of the third amplification stage if the first feedback capacitor is coupled to the input of the second amplification stage and the second feedback capacitor is coupled to the input of the second amplification stage if the first feedback capacitor is coupled to the input of the third amplification stage.

3. The amplifier of claim 2, wherein the first feedback capacitor and the second feedback capacitor are Miller capacitors.

4. The amplifier of claim 2, wherein each of the first amplification stage, the second amplification stage, and the third amplification stage has a transconductance, and wherein the transconductance of the third amplification stage is substantially greater than the transconductance of the first amplification stage and the transconductance of the second amplification stage.

5. The amplifier of claim 1, wherein the compensation network includes a plurality of RC networks, each RC network comprising a resistor and a capacitor coupled in series, each RC network coupled to the amplifier output.

6. The amplifier of claim 1, wherein the at least one RC network is a plurality of RC networks providing staggered at least one half pole roll off with approximately a forty five degree phase margin per RC network.

7. The amplifier of claim 1, wherein the at least one RC network is a plurality of RC networks coupled in parallel, a first RC network comprises a resistor having a first resistance value and a first capacitor having a first capacitance value, and a RC second network comprising a second resistor having a value equal to the first resistance value and a second capacitor having a value equal to half of the first capacitance value.

8. The amplifier of claim 1, wherein the at least one RC network is a plurality of RC networks coupled in parallel, a first RC network comprises a resistor having a first resistance value and a first capacitor having a first capacitance value, each successive RC network comprises a resistor and a capacitor wherein the value of the capacitor is equal to half the capacitance value of the capacitor in the immediately preceding RC network.

9. The amplifier of claim 8, wherein all of the resistors have substantially the same value.

10. The amplifier of claim 1, wherein the at least one RC network comprises a plurality of RC networks coupled in parallel to the amplifier output, a first RC network tuned to a first frequency and each successive RC network being tuned to twice the frequency of the immediately previous RC network.

11. The amplifier of claim 1, wherein a phase shift at the amplifier output is approximately forty-five degrees at an operating frequency of the amplifier.

12. An amplifier comprising:
- an amplifier input and an amplifier output;
- a first amplification stage having an input and an output, the input of the first amplification stage being coupled to the amplifier input;
- a second amplification stage having an input and an output, the input of the second amplification stage being coupled to the output of the first amplification stage;
- a third amplification stage having an input and an output, the input of the third amplification stage being coupled to the output of the second amplification stage and the output of the third amplification stage being coupled to the amplifier output;
- at least one feedback capacitor coupled between the amplifier output and at least one of: the input of the second amplification stage and the input to the third amplification stage; and
- a compensation network coupled to the amplifier output, the compensation network comprising a plurality of RC networks, a first of the RC networks tuned to a first frequency in which the amplifier operates, successive ones of the RC networks tuned to multiples of the first frequency, the compensation network providing at least one zero to compensate for at least one pole introduced by a load coupled to the amplifier output.

13. The amplifier of claim 12, wherein each of the first amplification stage, the second amplification stage, and the third amplification stage has a transconductance, and wherein the transconductance of the third amplification stage is substantially larger than the transconductance of the first amplification stage and the transconductance of the second amplification stage.

14. The amplifier of claim 12, wherein the plurality of RC networks provide staggered at least one half pole roll off with approximately a forty five degree phase margin per RC network.

15. The amplifier of claim 12, wherein the plurality of RC networks are coupled in parallel, a first RC network comprises a resistor having a first resistance value and a first capacitor having a first capacitance value, and a second RC network comprising a second resistor having a value equal to the first resistance value and a second capacitor having a value equal to half of the first capacitance value.

16. The amplifier of claim 12, wherein the plurality of RC networks are coupled in parallel, a first RC network comprises a resistor having a first resistance value and a first capacitor having a first capacitance value, each successive RC network comprises a resistor and a capacitor wherein the value of the capacitor is equal to half the capacitance value of the capacitor in the immediately preceding RC network.

17. The amplifier of claim 12, wherein the plurality of RC networks are coupled in parallel to the amplifier output, a first RC network is tuned to a first frequency and each successive RC network is tuned to twice the frequency of the immediately previous RC network.

18. An amplifier comprising:
- an amplifier input and an amplifier output;
- a first amplification stage having an input, an output, and a first transconductance, the input of the first amplification stage being coupled to the amplifier input;
- a second amplification stage having an input, an output, and a second transconductance, the input of the second amplification stage being coupled to the output of the first amplification stage;
- a third amplification stage having an input, an output, and a third transconductance, the input of the third amplification stage being coupled to the output of the second amplification stage and the output of the third amplification stage being coupled to the amplifier output;
- a first feedback capacitor coupled between the amplifier output and the input of the second amplification stage;
- a second feedback capacitor coupled between the amplifier output and the input of the third amplification stage; and
- a compensation network coupled to the amplifier output, the compensation network comprising a plurality of RC networks coupled in parallel to the amplifier output, a first RC network tuned to a first frequency and each successive RC network being tuned to twice the frequency of the immediately previous RC network, the compensation network providing at least one zero to compensate for at least one pole introduced by a load coupled to the amplifier output.

* * * * *